United States Patent
Fluekiger et al.

(10) Patent No.: US 7,476,281 B2
(45) Date of Patent: Jan. 13, 2009

(54) METHOD FOR PRODUCING A SUPERCONDUCTIVE ELEMENT

(75) Inventors: René Fluekiger, Plan-les-Ouates (CH); Vital Abaecherli, Les Acacias (CH)

(73) Assignee: Bruker Biospin AG, Faellanden (CH)

(*) Notice: Subject to any disclaimer, the term of this patent is extended or adjusted under 35 U.S.C. 154(b) by 439 days.

(21) Appl. No.: 11/223,053

(22) Filed: Sep. 12, 2005

(65) Prior Publication Data

US 2007/0227622 A1    Oct. 4, 2007

(30) Foreign Application Priority Data

Sep. 16, 2004  (EP)  .................................. 04021982

(51) Int. Cl.
*H01L 39/24* (2006.01)

(52) U.S. Cl. ............................... 148/98; 148/96; 29/599

(58) Field of Classification Search ........................ None
See application file for complete search history.

(56) References Cited

U.S. PATENT DOCUMENTS 3,665,595 A * 5/1972 Tanaka et al. .................. 29/599

(Continued)

FOREIGN PATENT DOCUMENTS

DE        37 18 258        12/1988

(Continued)

OTHER PUBLICATIONS

Cortie M. B. et al.: "The decomposition of the beta phase in the copper-tin system" Metallurgical Transactions A (Physical Metallurgy and Materials Science) USA, vol. 22A, no. Jan. 1, 1991, pp. 11-18.

(Continued)

*Primary Examiner*—John P. Sheehan
(74) *Attorney, Agent, or Firm*—Paul Vincent

(57) ABSTRACT

A method for producing a superconductive element, in particular a multifilament wire, starting from a composite (1) comprising a bronze matrix containing Cu and Sn, in which at least one elongated structure containing Nb or an Nb alloy, in particular NbTa, is embedded, whereby in a first step the composite is extruded at a temperature between 300° C. and 750° C., followed by cold or hot working and annealing steps in which the composite is elongated in parallel to the elongated structure and softened by a temperature treatment (="intermediate annealing"), followed by a stacking step, in which a multitude of elongated composites from the preceding cold or hot working steps are bundled, the steps of extruding, elongating, annealing and stacking being repeated one or more times, followed by a final elongating process, including intermediate annealing processes, in which the composite is elongated to its final length, the superconductive phase being obtained by a heat treatment including a solid state diffusion reaction is characterized in that at least part of the elongating steps and annealing steps are performed by cold working preceded by an intermediate annealing between 520° C. and 750° C., i.e. above the normal Cu—Sn recrystallization temperature, and by a fast cooling within less than 30 s to 100° C. or below (="Rapid Intermediate Quenching" [RIQ]).

14 Claims, 2 Drawing Sheets

U.S. PATENT DOCUMENTS

| | | |
|---|---|---|
| 3,918,998 A | 11/1975 | Marancik |
| 4,224,087 A * | 9/1980 | Tachikawa et al. ............ 148/98 |
| 4,776,899 A | 10/1988 | Murase |
| 5,228,928 A | 7/1993 | Suzuki et al. |
| 6,849,137 B2 * | 2/2005 | Iwaki et al. .................... 148/98 |
| 2002/0037816 A1 * | 3/2002 | Kikuchi et al. .............. 505/951 |
| 2002/0179184 A1 * | 12/2002 | Rudziak et al. ............... 148/98 |
| 2002/0194724 A1 * | 12/2002 | Wong .......................... 29/599 |
| 2003/0074779 A1 * | 4/2003 | Wong .......................... 29/599 |
| 2006/0081307 A1 * | 4/2006 | Field et al. .................... 148/98 |

FOREIGN PATENT DOCUMENTS

| | | |
|---|---|---|
| EP | 0 048 313 | 3/1982 |
| GB | 1 543 149 | 3/1979 |
| WO | WO 2004/040663 | 5/2004 |

OTHER PUBLICATIONS

Simon Foner and Brian B. Schwartz; "Superconductor Materials Science Metallurgy, Fabrication, and Applications", B-Physics vol. 68 pp. 275-388, Plenum Press, New York and London, (1981).

* cited by examiner

METHOD FOR PRODUCING A SUPERCONDUCTIVE ELEMENT

This application claims Paris Convention priority of EP 04 021 982.6 filed Sep. 16, 2004 the complete disclosure of which is hereby incorporated by reference.

BACKGROUND OF THE INVENTION

The invention relates to a method for producing a superconductive element, in particular a multifilament wire, starting from a composite comprising a bronze matrix containing Cu and Sn, in which at least one elongated structure containing Nb or an Nb alloy, in particular NbTa, is embedded, whereby in a first step the composite is extruded at a temperature between 300° C. and 750° C., followed by cold or hot working and annealing steps in which the composite is elongated in parallel to the elongated structure and softened by a temperature treatment, called intermediate annealing further on, followed by a stacking step, in which a multitude of elongated composites from the preceding cold or hot working steps are bundled, the steps of extruding, elongating, annealing and stacking being repeated one or more times, followed by a final elongating process, including intermediate annealing processes, in which the composite is elongated to its final length, the superconductive phase being obtained by a heat treatment including a solid state diffusion reaction.

A method of this type is described in the article "Fabrication Technology of Superconducting Material" by H. Hillmann in "Superconductor Materials Science: Metallurgy, Fabrication and Applications", ed. by S. Foner and B. Schwartz, NATO advanced study institutes series, B-Physics, Vol. 68, pp. 275-388, Plenum Press, New York/London, 1981.

Superconductive wires containing a superconductive $Nb_3Sn$ phase are typically produced by the powder in tube process (PIT-process), by the internal Sn diffusion method, or by the bronze route.

In the bronze route, a number of niobium (Nb) rods are inserted into a copper (Cu) and tin (Sn) containing bronze matrix. By repeated extruding, bundling and insertion into further bronze cans, a ductile wire with numerous Nb fibers embedded in a bronze matrix is obtained. Some pure copper is also introduced into the wire in order to improve its thermal conductivity. The wire is then brought into the desired shape, e.g. by winding the wire into a coil. Subsequently, the wire is annealed at a temperature of about 600-700° C. During this solid state diffusion reaction, Sn originating form the bronze diffuses into the Nb fibers and forms $Nb_3Sn$, which has superconductive characteristics. The superconductive $Nb_3Sn$ phase is also called A15 phase.

$Nb_3Sn$ with low Sn content exhibits inferior superconductive properties, in particular a low critical temperature $T_c$ and low upper critical magnetic field strength $B_{c2}$. Therefore, high and homogeneous Sn contents in the $Nb_3Sn$ phase are desired. The Sn content in the $Nb_3Sn$ phase can be increased by increasing the annealing temperature (=reaction temperature) and/or the annealing time (=reaction time). However, this also induces accelerated grain growth, which deteriorates the superconductive properties of the filament again.

The described Bronze route process is well established at the present day for bronzes containing up to ~16 wt. % Sn (9.1 at. % Sn) in the unreacted wire, the fabrication method covering the largest part of the market. However, recent important progress in the two other techniques, the "Internal Sn" process and the Powder-In-Tube (or PIT) process has created a new situation: a further improvement of the critical current densities of bronze route $Nb_3Sn$ wires is mandatory to remain competitive in the market.

In U.S. Pat. No. 5,228,928, a method of manufacturing a $Nb_3Sn$ superconducting wire is described in which the Sn content of the bronze matrix is increased leading to an increased amount of the $Nb_3Sn$ phase thus improving the superconducting properties of the wire. The workability of the wire with increased Sn content is improved by dividing an intermetallic compound phase in the bronze into small pieces by cold or warm working at temperatures below the recrystallization temperature of the bronze matrix.

It is the object of the invention to provide a method for producing a superconductive element which has improved superconductive properties in a large volume fraction of its superconductive filaments, in particular a high critical temperature $T_c$ and a high upper critical magnetic field strength $B_{c2}$, and which is mechanically stable enough for commercial applications such as magnet coils.

SUMMARY OF THE INVENTION

This object is achieved, in accordance with the invention, by a method in which at least part of the cold or hot working and annealing steps are performed by cold working preceded by an intermediate annealing between 520° C. and 750° C., i. e. above the normal Cu—Sn recrystallization temperature, and by a fast cooling within less than 30 s to 100° C. or below. This new method is further on denoted Rapid Intermediate Quenching (RIQ).

In an elongation process by cold working, normally a composite softened by heat treatment is used. This heat treatment is normally done at the recrystallization temperature of the bronze matrix followed by a slow cooling to room temperature. If this method is applied on a bronze consisting of more than 15.8 wt. % Sn, the annealed bronze matrix contains a considerable fraction of hard δ phase which makes the composite brittle and impossible to cold work. In the Rapid Intermediate Quenching (RIQ) method, the softening treatment (=intermediate anneal) is performed at temperatures between 520 and 750° C. followed by a fast cooling. By this fast cooling, the formation of δ phase is suppressed and the composite is quite ductile which can be subjected to elongation by cold working.

Superconductive $Nb_3Sn$ wires produced by the inventive method show high mechanical stability, small effective filament diameter and high homogeneity for very long lengths (well above 3 km). The final wire diameter is of the order of 1 mm. At this point, the Nb filament is around 5 μm, the total number of filaments reaching up to 10,000 or more.

In a preferred variant of this method, the temperature of the intermediate anneal can be chosen between 520 and 590° C., but preferably between 590 and 750° C. The fast cooling from a temperature between 590 and 750° C. causes a higher ductility of the bronze in the composite.

In another preferred variant of this method, the composites undergo a pre-heating step at temperatures preferably between 300 and 520° C. prior to the intermediate annealing step. This reduces the exposure time of the composite to temperatures above 520° C. to a minimum and reduces therefore the danger of pre-reaction between Nb and Sn.

In a further preferred variant of this method, the intermediate annealing treatment is done in a heating fluid. The use of a heating fluid permits a precise control of the temperature and duration of the intermediate anneal. The heating fluid can be for example a liquid metal bath, which does not dissolve the composite, or a liquid salt bath.

In another variant, the cooling rate at the end of the RIQ is chosen to be less than 10 s. A fast cooling rate retains the high temperature phases γ or β, avoiding the formation of hard δ phase, especially bronzes with high tin contents above 15.8 wt. %.

A preferred further variant is characterized in that the end temperature after the fast cooling is below 100° C. If the end temperature is higher than 100° C., the ductility of the fast cooled bronze may be worsened again.

In another preferred variant the fast cooling is actively performed by using a cooling fluid. As a cooling fluid, water may be used.

In another preferred variant cold working is done on the composites performed preferably within the next about 2 hours after the fast cooling. If the cold working is done much later, the ductility of the fast cooled bronze may be worse again.

A further preferred variant is characterized in that part of the cold work is done by cold drawing using cassette roller dies. This can enhance the reduction in cross section that can be applied on the composite between two intermediate anneals using the RIQ method.

Especially in the scope of the present invention is a superconductive element produced by a process as mentioned above, characterized in that the concentration of Sn in the bronze matrix is between 16% and 30% of weight with respect to the Cu content, preferably up to 27%. The increased concentration of Sn increases the Sn content of the $Nb_3Sn$ superconductive phase and consequently the superconducting current $j_c$.

In a preferred embodiment, the bronze matrix of the superconductive element contains at least one of the following additives with up to 5% weight: Ga, Al, Mg, Ti, Zr, Zn, Hf, In. These additives improve the properties of the superconductive element and/or the workability of the composite during production.

In a further preferred embodiment, the Nb alloy of the elongated structure contains at least one of the following additives with up to 10% weight, preferably up to 8% weight: Ta, V, Ti, Mo. These additives improve properties of the superconductive $Nb_3Sn$ phase of the superconductive element.

In a highly preferred embodiment, the elongated structure of the superconductive element is an elongated hollow pipe having an inner surface and an outer surface, wherein the outer surface and the inner surface are in close contact with the bronze matrix. Such a composite structure is used in the conventional double bronze route. The double bronze route can be improved by enclosing an elongated core consisting of a metallic material in the central region of the composite, as described in European Patent Application Nr. 04004605.4.

In an alternative preferred embodiment, the elongated structure of the superconductive element is an elongated rod having an outer surface, wherein the outer surface is in close contact with the bronze matrix. Such a composite structure is used in the conventional bronze route.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawings.

DESCRIPTION OF THE PREFERRED EMBODIMENT

Figure 2:
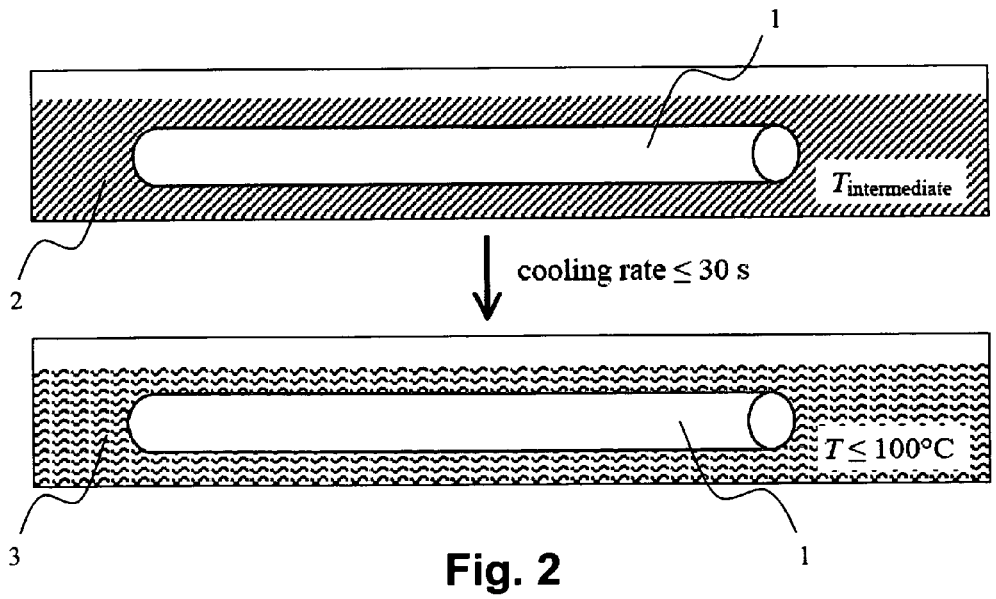
FIG. 2 shows a schematic view of a composite heated by a heated liquid and cooled by a cooling liquid.

An improved method for producing a superconductive element makes use of an intermediate anneal followed by a fast cooling, denoted as Rapid intermediate Quenching (RIQ) as illustrated in FIG. 2, which shows a schematic view of a composite 1 which may be structured according to the single bronze route as described in connection with FIG. 3 or according to the improved double bronze route as described in connection with FIG. 4. The composite 1 is heated by a heating liquid 2 and fast cooled by a cooling liquid 3. The heating liquid is brought to a temperature between 520 and 750° C. and the composite 1 is brought to a temperature between 300 and 520° C. by a pre-heating process prior to the intermediate anneal. The temperature of the composite 1 after the fast cooling by the cooling liquid 3 is at 100° C. or below, such that the ductility of the bronze is enhanced. Performing intermediate annealing in this way allows cold working without damaging of the composite 1 even if the bronze possesses a high Sn content.

Figure 1:
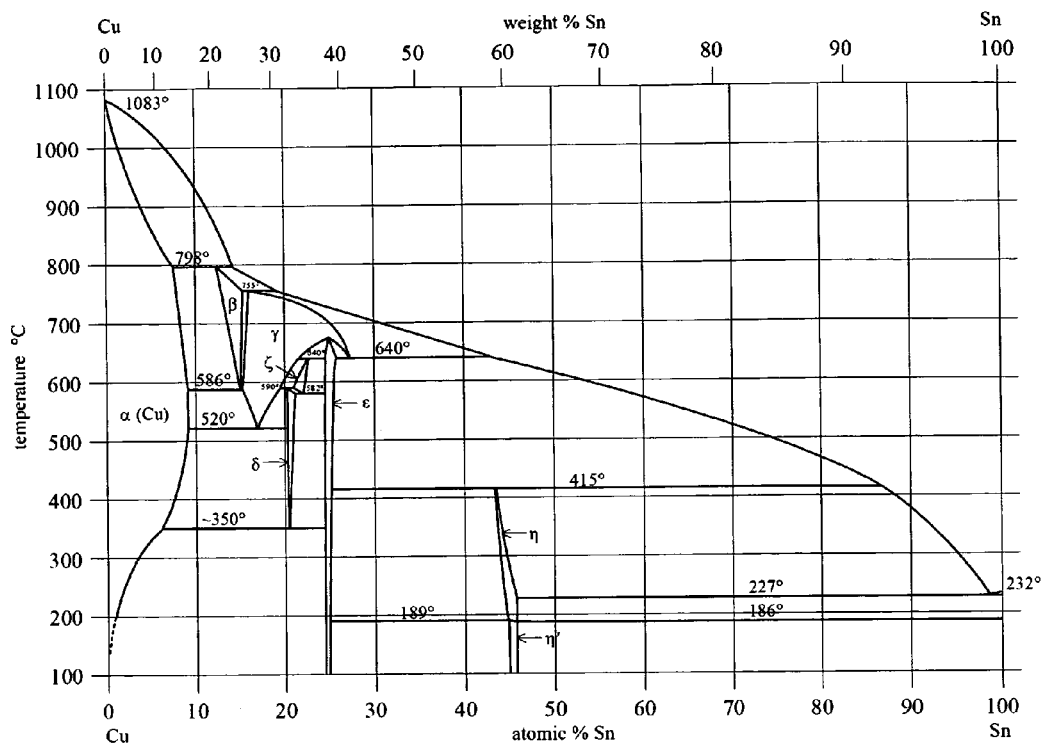
FIG. 1 shows a Cu—Sn equilibrium phase diagram with the most important thermodynamic stable phases near the copper-rich side.

For a better understanding of the different possibilities of producing superconductive elements making use of the Rapid Intermediate Quench (RIQ) described in FIG. 2, studying the thermodynamic properties of Cu—Sn bronze is mandatory. Therefore, FIG. 1 shows a Cu—Sn equilibrium phase diagram with the most important thermodynamic stable phases near the copper-rich side:

the α phase (Cu—Sn, fcc) with a range of stability from 0 to 15.8 wt. % Sn and a maximal solubility of 15.8 wt. % Sn at about 520° C., The β phase (Cu—Sn, bcc) with a range of stability from 22.0 to 26.0 wt. % Sn and an eutectoid point at 586° C. and 24.6 wt. % Sn, the γ phase ($Cu_3Sn$, cubic) with a range of stability from 25.5 to 41.5 wt. % Sn and an eutectoid point at 520° C. and 27.0 wt. % Sn, and the δ phase ($Cu_{41}Sn_{11}$, cubic) with a range of stability from 31.8 to 33.2 wt. % Sn and an eutectoid point at about 350° C. and 32.6 wt. % Sn.

The following three groups of bronzes relevant for the production of superconductive wires may be distinguished:

The α phase bronze is conventionally used for $Nb_3Sn$ bronze route conductor fabrication. It is a one phase alloy, if one neglects problems of Sn-segregation which can be solved using a spray deposition process (Osprey) for the bronze fabrication. Applying recrystallization anneals between ~450° C. and ~550° C., cold drawing is possible obtaining cross sectional reductions up to 65% limited by the strong work hardening of the α phase. In the α phase, the maximum content of Sn in the bronze is limited to 15.8 % of weight (9.1 atomic %). In order to increase superconductive properties of superconducting wires by increasing the Sn content of the bronze, it is therefore necessary to study the workability of other bronzes.

The two-phase α/β-bronze with 15.8 to 24.6 wt. % Sn contains a certain amount of intermetallic phases β, γ or δ, depending on temperature and alloy composition. The presence of hard intermetallic phases is an additional limitation for the cold workability. Deformation experiences with a spray deposited Cu 18 wt. % Sn bronze reveal still a somehow restricted workability under certain conditions: If the recrystallization is carried out at 620° C. (in the α/β-domain) and water quenched, cold drawing allows cross sectional reduction up to approx. 40%. If the recrystallization happens at 550° C. (α/γ-domain), the possible reduction is much smaller. The workability depends therefore strongly on the thermodynamic state during the recrystallization anneal, and also on the quenching speed at the end of the recrystallization anneal. One possible approach to improve workability is therefore to use intermediate anneals in the α/γ-domain or α/β-domain, followed by a fast cooling (RIQ) and cold working. Indeed, the fast cooled bronze has a higher ductility compared to a slowly cooled bronze due to the properties of the retained γ- or β-phase, respectively.

Finally, the β-bronze (Cu 24.6 wt. % Sn) is again a one phase alloy, if the temperature is held between 586 and about 750° C. Below, eutectoid decomposition generates α and γ or δ phase. In the article "The Decompositon of the Beta Phase in the Copper-Tin system" by M. B. Cortie, C. E. Mavrocordatos, Metallurgical Transactions A, Vol. 22 A, 1991, pp. 11-18, a cast bronze with Cu 24 wt. % Sn is homogenised, hot rolled from 50 to 5 mm in the β-domain between 650 and 700° C. and water quenched from 700° C. The wrought products are <<quite machinable>> at room temperature, which cannot be expected from an as-cast or slowly cooled bronze of the same alloy composition. It was found that quenching from the β- or α/β-domain produces a relatively ductile metastable material, but the quenched alloy ages at room temperature, enhancing its hardness and lowering both its ductility and tensile strength. For the production of a superconductive element using a β-bronze it is therefore necessary to perform all intermediate anneals by the RIQ-method.

Figure 3:
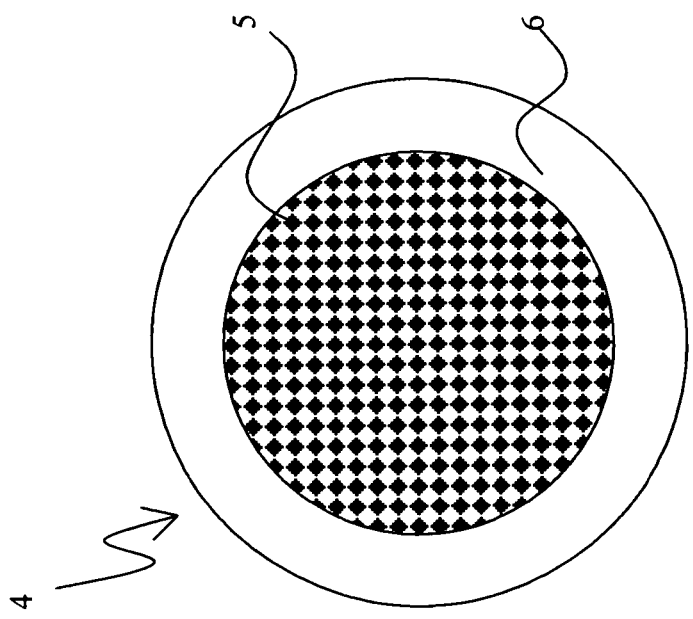
FIG. 3 shows a schematic cross-sectional view of a composite according to the single bronze route.

FIG. 3 shows a composite 4 of an usual single bronze route for fabrication of $Nb_3Sn$ wires with diameters of 4 to 5 µm. In a typical superconductive wire, there are some thousands of superconductive filaments, typically grouped in bundles. The bundles are usually grouped around a pure copper core or arranged within a pure copper tube (not shown). The composite 4 comprises an elongated rod 5 surrounded by a bronze matrix 6. The elongated rod 5 consists of ductile Nb (or NbTa), which reacts gradually with Sn (from the Cu—Sn bronze matrix 6) to $Nb_3Sn$ by annealing it at an elevated reaction temperature in order to induce a solid state diffusion reaction.

Typically the Nb content of the elongated rod 5 does not completely react to $Nb_3Sn$, but some Nb remains unreacted. Within the $Nb_3Sn$ phase, a concentration gradient is varying from 25 atomic % Sn content near the boundary to the bronze matrix 6 to a content of 18% Sn near the unreacted Nb core. In order to increase the amount of Nb reacting to $Nb_3Sn$, the double bronze route is used.

Figure 4:
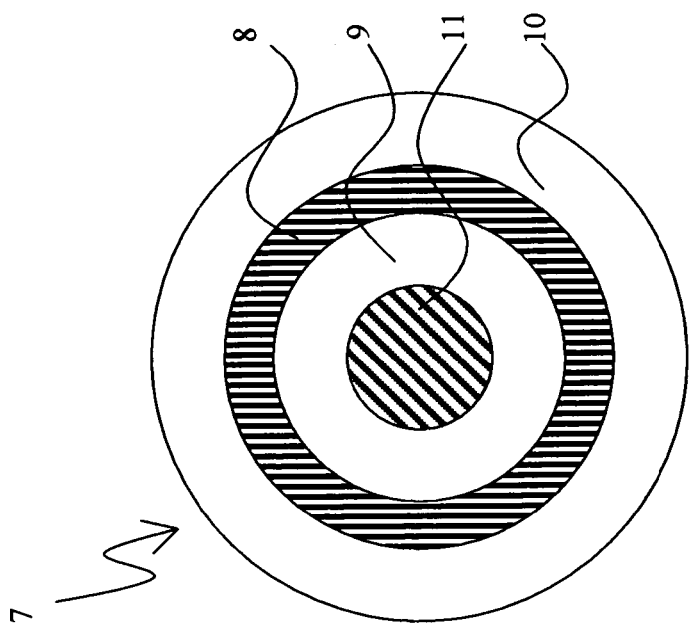
FIG. 4 shows a schematic cross-sectional view of a composite according to an improved double bronze route.

FIG. 4 shows a composite 7 according to the double bronze route. The main difference between the usual bronze route and the double bronze route consists in the fact that the elongated rod 5 is replaced by an elongated pipe 8. The material of the elongated pipe 8 contains Nb. The Nb is present as a substantially pure metal, or as a Nb containing mixed crystal. Preferably, the atomic concentration of Nb in the elongated pipe 8 is about 50% or more. In the present case, a Nb-7.5% Ta alloy is used.

The elongated pipe 8 has an inner surface and an outer surface. The inner surface is in close contact with an inner Cu—Sn bronze matrix 9. The outer surface of the elongated pipe 8 is in contact with a surrounding, outer bronze matrix 10. The outer bronze matrix 10 typically consists of the same material as the inner bronze matrix 9. The outer bronze matrix 10 can be ring-shaped in cross-section, but may also stretch along a wide area. In particular, the outer bronze matrix of a first composite structure may verge into an outer bronze matrix of a second, neighbouring composite structure (not shown).

In contrast to the conventional bronze route wires which show a filament diameter close to 5 µm and an effective diffusion length of the order of 2-2.5 µm, the double bronze technique allows a variation of the $Nb_3Sn$ wall thickness from 2 µm down to values well below 1 µm with the same number of extrusions. The overall filament diameter of double bronze wires can be varied within a wide range between 5 and 15 µm. This depends on the initial dimensions and does not require additional deformation steps. Further, in analogy to "in situ" wires with very thin filament diameters, the thin A15 wall thickness allows to obtain shorter reaction times, and thus smaller grain sizes. This is expected to considerably enhance the critical current density values, in particular at the industrially interesting intermediate field range of 12 to 16 T.

However, the wires produced by the conventional double bronze route do not exhibit higher $j_c$ values because of mechanical instabilities. The inner Cu—Sn bronze matrix 9 shrinks when cooled down. Not only there is no precompression effect, but in addition, radial stresses are introduced, finally leading to a damage of the A15 layer.

An improvement of the double bronze route is described in European Patent Application Nr. 04004605.4, avoiding the effect described above in that the inner bronze matrix 9 surrounds an inner metallic core 11 which consists of tantalum, being chemically inert and having a thermal expansion coefficient smaller than the surrounding inner bronze matrix 9. The tantalum core 11 shrinks less than the inner bronze matrix 9, lessening tensile stress exerted by the inner bronze matrix onto the elongated pipe 8 and thus avoiding mechanical instabilities, leading to higher values of the superconducting current $j_c$.

The present invention presents an improved production process for manufacturing superconducting elements in which the advantages of fast cooled intermediate anneals may be combined with the improved double bronze process and high mechanical stability and increased $j_c$ values of the superconducting elements are obtained. Superconducting elements produced by the inventive method therefore constitute promising components for future use in superconducting applications, e.g. for NMR solenoids, accelerator or fusion magnets etc.

We claim:
1. A method for producing a superconductive element or a multifilament wire, the method comprising the steps of:
   a) preparing a composite having a bronze matrix containing Cu and Sn in which at least one elongated structure containing Nb, a Nb alloy, or NbTa is embedded;
   b) extruding the composite at a temperature between 300° C. and 750° C.;
   c) elongating the composite in parallel to the elongated structure;
   d) annealing the composite;

e) stacking a plurality of annealed elongated composites, following steps a) through d), into a composite bundle;
f) repeating steps a) through e) at least one time; and
g) elongating the composite bundle following step f) in a final elongating procedure, the final elongating procedure comprising at least one intermediate annealing process in which the composite bundle is elongated to a final length, a superconductive phase being obtained by a heat treatment including a solid state diffusion reaction, wherein at least some of steps c) and d) comprise intermediate annealing of the composite bundle at a temperature above a normal Cu—Sn re-crystallization temperature and between 520° C. and 750° C. followed by fast cooling within less than 30 s to 100° C. or below (Rapid Intermediate Quenching or RIQ) and cold working the composite.

2. The method of claim 1, wherein an intermediate anneal temperature is chosen between 520° C. and 590° C.

3. The method of claim 1, wherein an intermediate anneal temperature is between 590° C. and 750° C.

4. The method of claim 1, wherein the intermediate annealing treatment is done in a heated fluid.

5. The method of claim 1, wherein a fast cooling rate is chosen to be less than 10 s.

6. The method of claim 1, wherein the fast cooling is actively performed by using a cooling fluid.

7. The method of claim 1, wherein a part of the cold working is performed by cold drawing using cassette roller dies.

8. The method of claim 1, wherein a concentration of Sn in the bronze matrix is between 16% and 30% of weight with respect to the Cu content.

9. The method of claim 1, wherein a concentration of Sn is up to 27% of weight with respect to the Cu content.

10. The method of claim 1, wherein the bronze matrix contains at least one of the following first additives with up to 5% weight: Ga, Al, Mg, Ti, Zr, Zn, Hf, In.

11. The method of claim 1, wherein the Nb alloy of the composite contains at least one of the following second additives with up to 10% weight Ta, V, Ti, Mo.

12. The method of claim 11, wherein the second additives are up to 8% weight.

13. The method of claim 1, wherein the composite is an elongated rod having an outer surface, wherein the outer surface is in close contact with the bronze matrix.

14. The method of claim 1, wherein the composite is an elongated hollow pipe having an inner surface and an outer surface, wherein the outer surface and the inner surface are in close contact with the bronze matrix.

* * * * *